(12) United States Patent
Wang et al.

(10) Patent No.: US 12,733,171 B2
(45) Date of Patent: Sep. 8, 2026

(54) SEMICONDUCTOR DEVICE STRUCTURE AND MANUFACTURING METHOD THEREFOR

(71) Applicant: YANGTZE MEMORY TECHNOLOGIES CO., LTD., Wuhan (CN)

(72) Inventors: Xin Wang, Wuhan (CN); Cheng Gan, Wuhan (CN); Wu Tian, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 940 days.

(21) Appl. No.: 18/079,822

(22) Filed: Dec. 12, 2022

(65) Prior Publication Data

US 2023/0124602 A1 Apr. 20, 2023

Related U.S. Application Data

(63) Continuation of application No. PCT/CN2021/124058, filed on Oct. 15, 2021.

(30) Foreign Application Priority Data

Oct. 15, 2020 (CN) ......................... 202011101325.0

(51) Int. Cl.
*H10B 43/40* (2023.01)
*G11C 16/24* (2006.01)
*H10B 41/41* (2023.01)

(52) U.S. Cl.
CPC ............. *H10B 43/40* (2023.02); *H10B 41/41* (2023.02); *G11C 16/24* (2013.01)

(58) Field of Classification Search
CPC ........ H10B 43/40; H10B 43/10; H10B 43/20; H10B 43/35; H10B 41/41; H10B 41/10;
(Continued)

(56) References Cited

U.S. PATENT DOCUMENTS 8,836,046 B2 9/2014 Maeda et al.
9,646,967 B2 5/2017 Kim
(Continued)

FOREIGN PATENT DOCUMENTS

CN 1235377 A 11/1999
CN 1925161 A 3/2007
(Continued)

OTHER PUBLICATIONS

First Office action issued in corresponding Chinese Application No. 202011101325.0, mailed on Jun. 15, 2021; 6 pages.
(Continued)

*Primary Examiner* — William B Partridge
*Assistant Examiner* — Linda J. Fleck
(74) *Attorney, Agent, or Firm* — BAYES PLLC

(57) ABSTRACT

Disclosed in the application are a semiconductor device structure and a manufacturing method thereof. The semiconductor device structure includes: a semiconductor substrate; active regions and isolation structures located in the semiconductor substrate and arranged alternately at intervals in a first direction, the active regions extending in a second direction perpendicular to the first direction; gate structures located at least on the active regions; and virtual structures located at least on the isolation structures, a spacing existing between the gate structures and the virtual structures in the second direction. The active regions further include source-doped regions and drain-doped regions located on two sides of the gate structures, projections of the virtual structures on the isolation structures are located between the source-doped regions, or projections of the virtual structures on the isolation structures are located between the drain-doped regions.

19 Claims, 6 Drawing Sheets

(58) Field of Classification Search
CPC ........ H10B 41/20; H10B 41/35; G11C 16/24; H10D 89/10
See application file for complete search history.

(56) References Cited

U.S. PATENT DOCUMENTS

2007/0208903 A1 9/2007 Gomikawa
2007/0278557 A1 12/2007 Chen et al.
2011/0188309 A1 8/2011 Endo
2013/0240956 A1 9/2013 Hou et al.
2016/0079125 A1* 3/2016 Kim .................. H10D 84/0158 438/283
2016/0190271 A1* 6/2016 You ..................... H10D 64/661 257/401
2018/0190666 A1 7/2018 Li
2020/0168511 A1 5/2020 Cheng et al.

FOREIGN PATENT DOCUMENTS

CN 101068020 A 11/2007
CN 102412156 A 4/2012
CN 102456739 A 5/2012
CN 105679757 A 6/2016
CN 105742355 A 7/2016
CN 107887272 A 4/2018
CN 108780813 A 11/2018
CN 109037308 A 12/2018
CN 109411465 A 3/2019
CN 110024124 A 7/2019
CN 110707090 A 1/2020
CN 110870061 A 3/2020
CN 111435662 A 7/2020
CN 112349722 A 2/2021

OTHER PUBLICATIONS

International Search Report issued in corresponding International Application No. PCT/CN2021/124058, mailed on Jan. 12, 2022, 4 pages .
Written Opinion issued in corresponding International Application No. PCT/CN2021/124058, mailed on Jan. 12, 2022, 4 pages.

* cited by examiner

SEMICONDUCTOR DEVICE STRUCTURE AND MANUFACTURING METHOD THEREFOR

CROSS-REFERENCE TO RELATED APPLICATIONS

The application is a continuation of International Application No. PCT/CN2021/124058, filed on Oct. 15, 2021, which claims the benefit of priority to Chinese Application No. 202011101325.0, filed on Oct. 15, 2020, the entire contents of which are incorporated herein by reference in their entireties.

BACKGROUND

With the development of memory technologies, a storage density of a planar memory cell is approaching an upper limit, thus a three-dimensional (3D) NAND technology arises. A 3D NAND memory structure may solve the limitation of the density in the planar memory cell. At present, a general 3D NAND structure includes a memory array and a peripheral device for controlling signals of the memory array, the peripheral device includes a bit line (BL) driver device, a page buffer, and the like. However, as the density of the memory cell in the 3D NAND structure increases, a size of the peripheral device is required to be relatively small. For example, the spacing between transistors of the BL driver device decreases, resulting in a high NUH/NUH punch-through risk, which is difficult to meet the desired performance of the device.

Therefore, it is necessary to provide a semiconductor device structure and a method for manufacturing the same, to resolve the foregoing problem in the related art.

SUMMARY

The disclosure relates to the technical field of manufacturing an integrated circuit (IC), and in particular to a semiconductor device structure and a method for manufacturing the same.

In view of the foregoing defects in the related art, the disclosure provides a semiconductor device structure, and the semiconductor device structure includes a semiconductor substrate, active regions, isolation structures, gate structures, and virtual structures.

The active regions and the isolation structures are located in the semiconductor substrate, the active regions and the isolation structures are arranged alternately at intervals in a first direction, and the active regions extend along a second direction perpendicular to the first direction.

The gate structures are located at least in the active regions.

The virtual structures are located at least on the isolation structures between adjacent active regions, a spacing exists between the gate structures and the virtual structures in the second direction.

The active regions further include source-doped regions and drain-doped regions located at two sides of the gate structures respectively, and projections of the virtual structures on the isolation structures are located between the source-doped regions, or, projections of the virtual structures on the isolation structures are located between the drain-doped regions.

In some embodiments, the gate structures and the virtual structures may contain the same material and may have the same height.

In some embodiments, the gate structures may include gate units that are in one-to-one correspondence with the active regions, span corresponding active regions in the first direction, and are electrically connected based on the same metal layer.

In some embodiments, a spacing may exist between adjacent gate units, and projections of two gate units corresponding to two adjacent active regions in the first direction overlap with projections of corresponding virtual structures between the active regions in the first direction.

In some embodiments, the gate structures may include strip gates spanning the active regions in the first direction.

In some embodiments, the active regions may further include lightly doped drain regions located at two sides of the gate structures.

In some embodiments, the semiconductor device structure may include a bit line (BL) driver device.

In some embodiments, the virtual structures may extend above the source-doped regions along the first direction to form overlapped regions, or, the virtual structures may extend above the drain-doped regions along the first direction to form the overlapped regions.

In some embodiments, sizes of the overlapped regions in the first direction may be included between ⅕ and ⅓ of the sizes of corresponding source-doped regions or drain-doped regions.

The disclosure further provides a method for manufacturing a semiconductor device structure, the manufacturing method may include the following operations.

A semiconductor substrate is provided.

Active regions and isolation structures are formed in the semiconductor substrate, the active regions and the isolation structures are arranged alternately at intervals in a first direction, and the active regions extend along a second direction perpendicular to the first direction.

Gate structures and virtual structures are manufactured on the semiconductor substrate, where the gate structures are formed at least on the active regions, and the virtual structures are formed at least on the isolation structures between adjacent active regions, a spacing exists between the gate structures and the virtual structures in the second direction.

Ion implantation is performed on the active regions to form source-doped regions and drain-doped regions at two sides of the gate structures respectively, and projections of the virtual structures on the isolation structures are located between the source-doped regions, or, projections of the virtual structures on the isolation structures are located between the drain-doped regions.

In some embodiments, the gate structures and the virtual structures may be manufactured based on the same process.

In some embodiments, the gate structures may include gate units that are in one-to-one correspondence with the active regions, span corresponding active regions in the first direction, and are electrically connected based on the same metal layer.

In some embodiments, a spacing may exist between adjacent gate units, and projections of the gate units corresponding to two adjacent active regions in the first direction overlap with projections of the virtual structures between the active regions in the first direction.

In some embodiments, the method may further include the following operations after forming the source-doped regions and the drain-doped regions. Ion doping is performed on the active regions at two sides of the gate structures, to form lightly doped drain regions.

In some embodiments, the virtual structures may extend above the source-doped regions along the first direction to form overlapped regions, or, the virtual structures may extend above the drain-doped regions along the first direction to form the overlapped regions.

In some embodiments, sizes of the overlapped regions in the first direction may be included between ⅕ and ⅓ of sizes of corresponding source-doped regions or drain-doped regions.

In some embodiments, the gate structures and the virtual structures may contain the same material and may have the same height.

In some embodiments, the gate structures may include strip gates spanning the active regions in the first direction.

In some embodiments, the semiconductor device structure may include a BL driver device.

EXPLANATION OF REFERENCE NUMBERS

Figure 1:
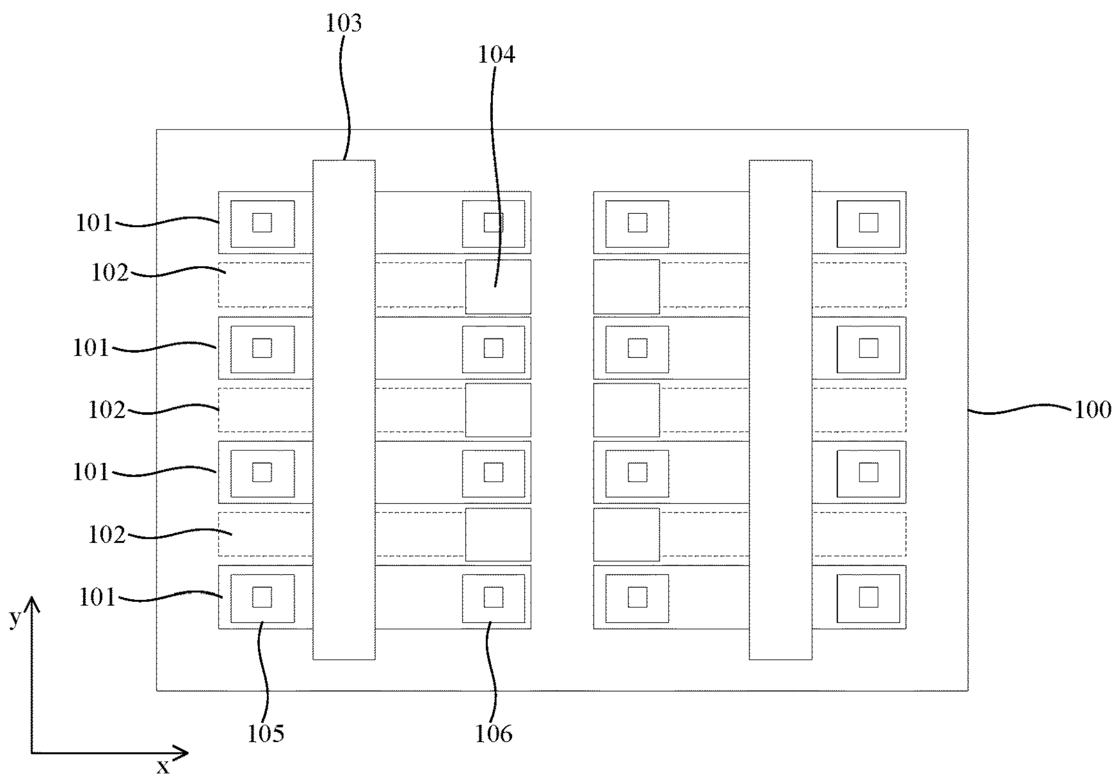
FIG. 1 illustrates a top view of an example of a semiconductor device structure according to the disclosure.

100 Semiconductor substrate
100*a* Well region
101 Active region
102 Isolation structure
103 Gate structure
104 Virtual structure
105 Source-doped region
106 Drain-doped region
107 Gate unit
108 Metal layer
S1~S3 Operations

DETAILED DESCRIPTION

The following examples are used to explain implementations of the disclosure, and those skilled in the art may learn other advantages and efficacy of the disclosure easily by using contents disclosed in the specification. The disclosure may also be implemented or applied by using different implementations, and details in the specification may also be modified or changed without departing from the spirit of the disclosure.

For example, when embodiments of the disclosure are described in detail, cross-sectional views illustrating device structures may not be enlarged partially according to a general scale, for ease of description. In addition, the schematic diagrams are only examples, which are not intended to limit the protection scope of the disclosure. In addition, 3D space sizes of length, width, and depth should be included in actual manufacturing.

For ease of description, space relationship words such as "below," "under," "lower," "underneath," "above," "on" and the like may be used to describe a relationship between an element or feature and other elements or features shown in the drawings. It should be understood that these space relationship words are intended to include other directions of the device in use or operation, besides directions depicted in the drawings. In addition, when a layer is referred to be "between" two layers, it may be the only layer between the two layers, or there may be one or more layers between the two layers. In addition, "between . . . and . . . " used in the disclosure includes values of two end points.

In the context of the disclosure, a described structure in which a first feature is located "above" a second feature may include an embodiment that the first feature is in direct contact with the second feature, or may include an embodiment that other features are formed between the first feature and the second feature, and in this case, the first feature may not be in direct contact with the second feature.

It should be noted that the drawings provided in the embodiments are only used as examples to illustrate the basic idea of the disclosure, therefore, only components related to the disclosure are shown in the drawings and are not drawn according to quantities, shapes, and sizes of the components as in practice. In practice, types, quantities, and proportions of the components may be changed arbitrarily, and the layout of the components may be more complex.

As shown in FIG. 1 to FIG. 4, the disclosure provides a semiconductor device structure, the semiconductor device structure includes: a semiconductor substrate 100; active regions 101 and isolation structures 102 located in the semiconductor substrate 100; gate structures 103 located at least on the active regions 101; and virtual structures 104 located at least on the isolation structures 102 between adjacent active regions.

Here the semiconductor substrate 100 may be configured to form a substrate of a periphery device of a 3D NAND memory, such as a Complementary Metal Oxide Semiconductor (CMOS) wafer substrate. The semiconductor substrate 100 may be a single-layer material layer, or may be an overlapped-layer material layer. Material of the semiconductor substrate may include silicon (such as monocrystalline silicon), silicon-germanium (SiGe), germanium (Ge), silicon on insulator (SOI), germanium on insulator (GOI), gallium arsenide (GaAs), gallium nitride, silicon carbide, glass, groups III-V compound, any other suitable materials or any combination thereof. In some embodiments, double-sided polishing may be performed on the semiconductor substrate 100 before the periphery device is manufactured. Both the semiconductor substrate and the periphery device are polished and processed to provide a smooth surface for a semiconductor device of high quality. The periphery device may include any suitable semiconductor devices, such as a Metal Oxide Semiconductor Field Effect Transistor (MOSFET), a Bipolar Junction Transistor (BJT), a diode, a resistor, a capacitor, an inductor, and the like. In the semiconductor devices, at least one of a p-type MOSFET or an n-type MOSFET (that is, CMOS) is widely used in designing logic circuits. In addition, the peripheral device may be a p-channel MOSFET or an n-channel MOSFET. In an example, ion doping may further be performed on the semiconductor substrate 100 to form well regions 100*a*, which are wells formed by using n-type doping or p-type doping in an active device region.

The semiconductor device may further include active regions 101 and isolation structures 102. A first direction and a second direction perpendicular to each other are defined in a plane where the semiconductor substrate 100 is located, corresponding to a y direction and an x direction in the drawing respectively. The active regions 101 and the isolation structures 102 are arranged alternately at intervals in the first direction, the active regions 101 extend along the second direction. The number of the active regions 101 and the isolation structures 102 may be set according to actual requirements.

At present, as a size of a device continuously decreases, the spacing between adjacent active regions gradually decreases, for example, in the first direction. For a BL driver device according to the disclosure, that is, the semiconductor device structure is used as the BL driver device, a 3D NAND structure includes a memory array and a peripheral device for controlling signals of the memory array, and the peripheral device includes a BL driver device. In a current design of a 3D-NAND device, the BL driver device is a UHVN hybrid NMOS array structure. During cell erasing and programming, adjacent transistors of the BL driver device are required to bear a pressure difference of about 2.4 V, and the spacing between adjacent transistors (as shown in dotted lines in the drawing) is only 0.386 μm. Therefore, the two transistors of the BL memory have a relatively high NUH/NUH punch-through risk.

Further, the semiconductor device structure according to the disclosure is further manufactured with gate structures 103 and virtual structures 104. The gate structures 103 are arranged at least on the active regions 101 to be used as a gate of the device.

The semiconductor device structure includes the virtual structures 104, and a spacing exists between the gate structures 103 and the virtual structures 104, that is, the gate structures 103 are not in contact with the virtual structures 104. According to the disclosure, the virtual structures 104 are arranged at least on the isolation structures 102, and the virtual structures 104 arranged on the isolation structures 102 may block a part of LDD ion implantation and source-drain implantation (N/P implantation), and reduce implanted ion implanted below. Therefore, the isolation capability of isolation structures 102 may be enhanced, and a punch BV between adjacent transistors may be increased, to effectively prevent the breakdown of adjacent transistors. In addition, according to the disclosure, the virtual structures 104 are arranged on the isolation structures 102, and a spacing exists between the virtual structures and the gate structures 103 in a plane where the plane of the semiconductor substrate 100 is located, and it is unnecessary to provide an additional device area.

In an example, the gate structures 103 and the virtual structures 104 may contain the same material, which is polysilicon in the example. The gate structures 103 and the virtual structures 104 may have the same height. That is, in the example, the virtual structures 104 are configured to have a structure consistent with that of the gate structures 103, and a spacing s there-between is included between 0.5 μm to 1 μm, for example, the spacing s may be 0.6 μm or 0.8 μm. In an example, the virtual structures 104 are located between drain-doped regions of adjacent active regions, and the spacing between the virtual structures 104 and the gate structures 103 is 0.7 μm. In an example, the virtual structures and neighboring heavily doped regions (drain-doped regions) have the same length, that is, the virtual structures and the neighboring heavily doped regions have the same length in the second direction. Therefore, the virtual structures 104 and the gate structures 103 may be manufactured based on the same process, and it is unnecessary for the introduction of the virtual structures 104 to change any process conditions and operations either, so that the process is simple and feasible.

Figure 4:
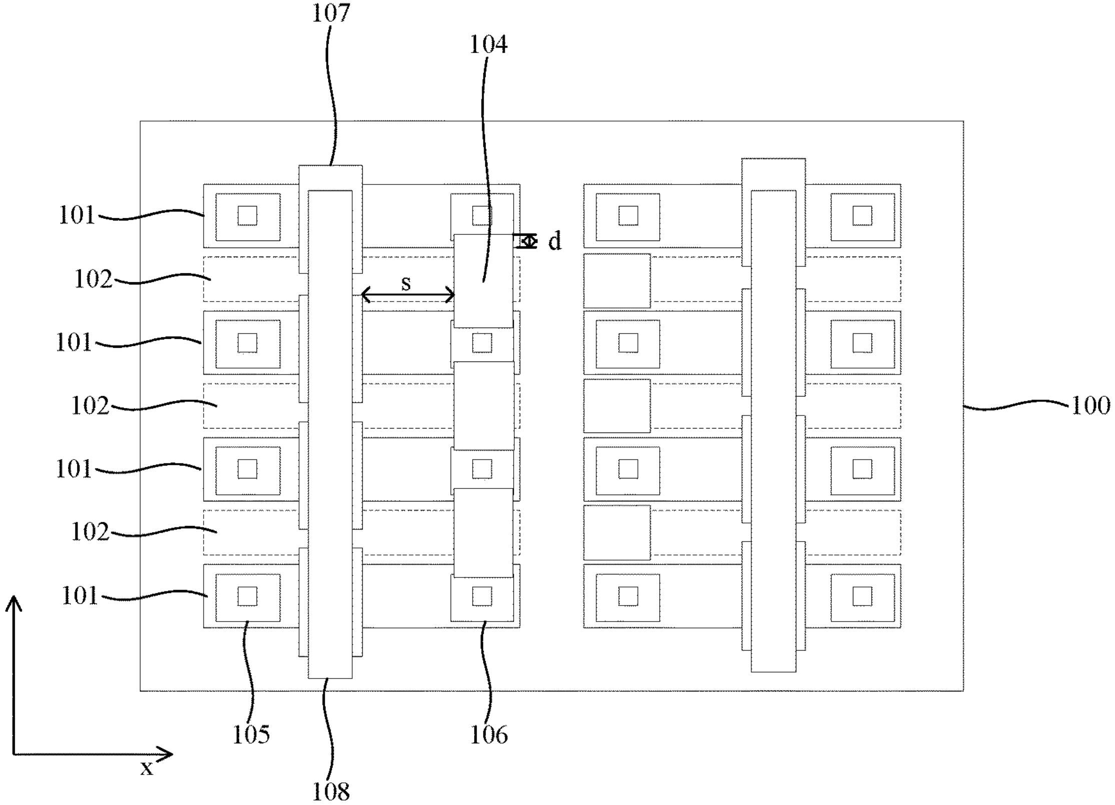
FIG. 4 illustrates a top view of yet another example of a semiconductor device structure according to the disclosure.

In an example, as shown in FIG. 4, the gate structures may include gate units 107 which are in one-to-one correspondence with the active regions 101, span corresponding active regions 101 in the first direction, and are electrically connected based on a same metal layer 108. In the example, the gate is designed as separate gate units 107, which may reduce areas between the active regions covered by the gate structures, to increase a threshold voltage of a Field Effect Transistor (FET), increase the punch BV, and improve performance of a memory cell when the spacing between transistors decreases. In addition, based on the gate designed as separate gate units 107, the separate gate units may further reduce the punch-through risk of adjacent devices. Therefore, the punch-through problem of adjacent transistors of the BL driver device proposed in the disclosure may be resolved based on joint action of the gate units 107 and the virtual structures 104. In addition, in the example, electrical connections between the gate units 107 are implemented by using the metal layer 108, the series resistance is further reduced, and the transmission current of the BL driver device is also increased.

In an example, a spacing may exist between adjacent gate units 107, and projections of two gate units 107 corresponding to two adjacent active regions 101 in the first direction overlap with projections of corresponding virtual structures 104 between the active regions 101 in the first direction. That is, both the two adjacent gate units 107 and one of the virtual structures 104 between the two adjacent gate units project on the Y-axis, and projections of the three components are not spaced apart and form a continuous line.

Figure 2:
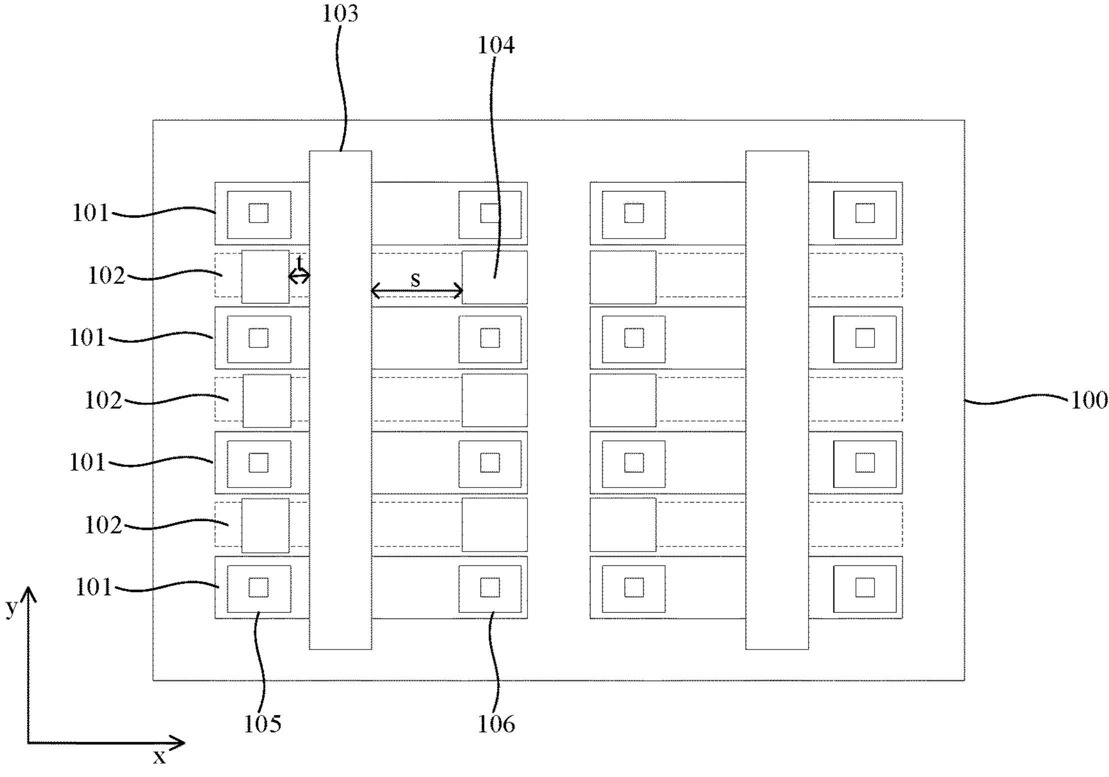
FIG. 2 illustrates a top view of another example of a semiconductor device structure according to the disclosure.
Figure 3:
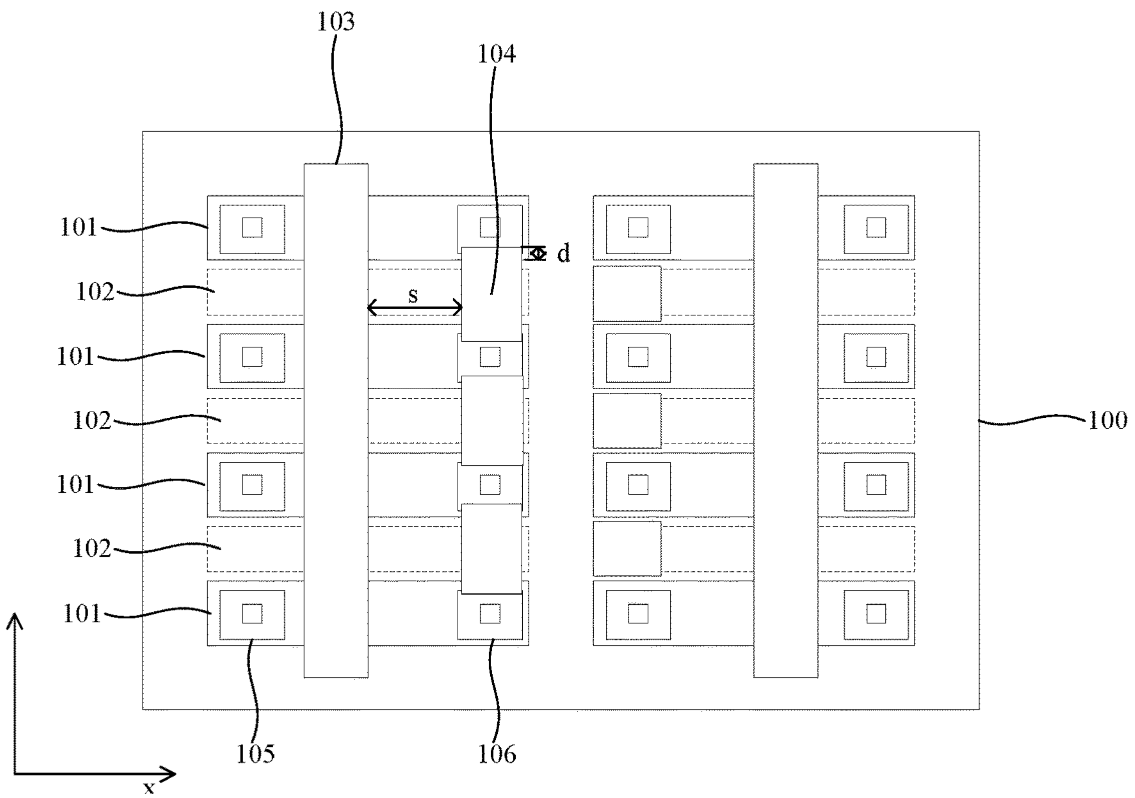
FIG. 3 illustrates a top view of still another example of a semiconductor device structure according to the disclosure.

In an example, referring to FIGS. 1 to 3, the gate structures may include strip gates spanning the active regions in the first direction. In the example, an entire strip gate is used to implement an electrical connection of the active regions with a common gate.

In an example, the active regions 101 further include source-doped regions 105 and drain-doped regions 106 located at two sides of the gate structures 103 respectively. Correspondingly, the virtual structures 104 are located between the source-doped regions 105 of adjacent active regions 101 or between the drain-doped regions 106 of adjacent active regions 101. The source-doped regions 105 and the drain-doped regions 106 are arranged in the second direction to be used as a source and a drain of the device. The virtual structures 104 may be only arranged at positions corresponding to the drain-doped regions 106 of adjacent active regions 101. As shown in FIG. 1, the virtual structures may also be arranged between adjacent source-doped regions 105 and between adjacent drain-doped regions 106. That is, as shown in FIG. 2, projections of the virtual structures 104 on the isolation structures 102 are located between the source-doped regions 105, and/or, projections of the virtual structures 104 on the isolation structures 102 are located between the drain-doped regions 106. A spacing between the virtual structures located between the drain-doped regions 106 and the gate structures is denoted by s, and a spacing between the virtual structures located between the source-doped regions 105 and the gate structures is denoted by t. In an example, because the drain may be applied with a voltage, its punch-through problem should be considered, and the source does not need to be applied with a voltage, its punch-through problem should not be considered. A length of s is set to be included between 0.5 μm and 1 μm, for example, it may be 0.6 μm or 0.8 μm. A length of t may be flexibly designed according to actual requirements.

Figure 12:
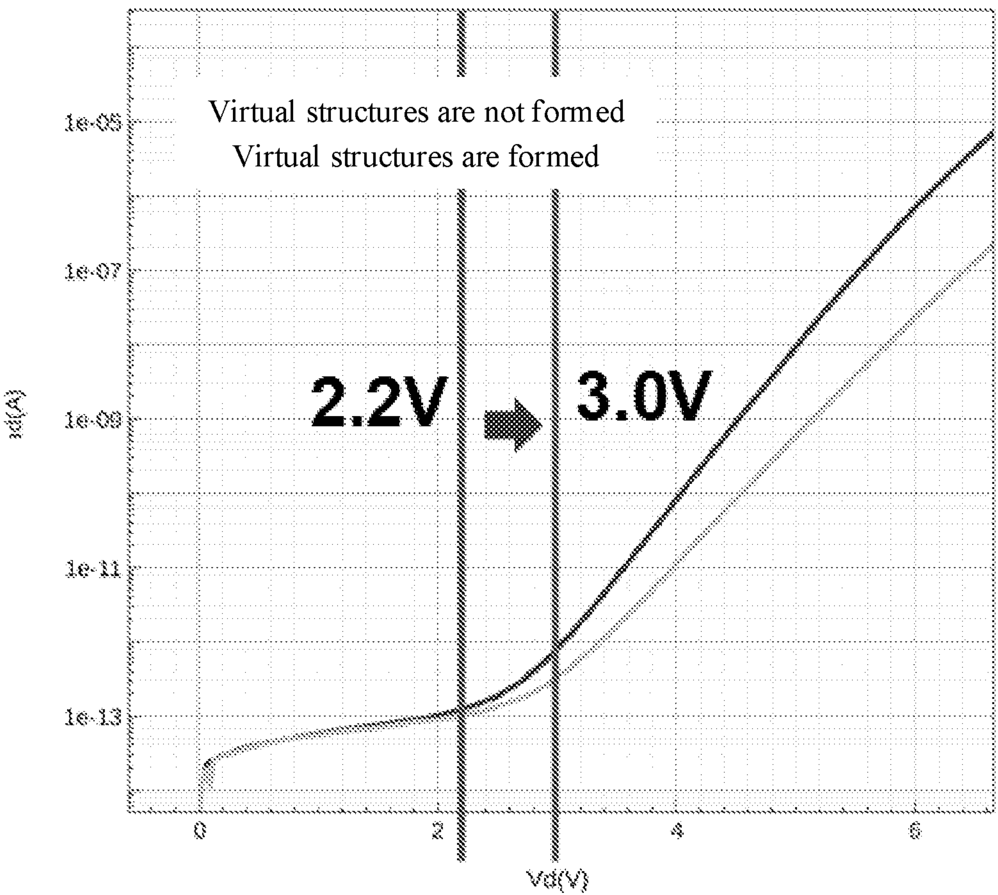
FIG. 12 illustrates a curve diagram showing influences of a solution with virtual structures formed according to the disclosure and a solution without forming virtual structures on a punch breakdown voltage (BV) of a BL driver device.

In a further example, the virtual structures 104 may also extend above the source-doped regions 105 or the drain-doped regions 106 of two adjacent active regions along the first direction, to form overlapped regions. As shown in FIG. 3, the virtual structures 104 located between the drain-doped regions 106 of adjacent active regions is taken as an example for description. The virtual structures 104 span the isolation structures 102 below them, and further extend towards two sides thereof. In an example, a width of a region extending to two sides to be overlapped with the drain-doped regions 106 in the first direction is d. In an example, distances extended to the drain-doped regions at two sides are equal, and d is between 0.05 μm and 0.2 μm, for example, it may be 0.08 μm, 0.1 μm, 0.12 μm, 0.15 μm, or 0.18 μm. The virtual structures block ion implantation of LDD, so that the concentration of LDD is decreased, and the punch-through risk is reduced. In an example, a doped dose of LDD is between $5e^{10}$ n/cm$^2$ and $5e^{13}$ n/cm$^2$, for example, it may be $5e^{12}$ n/cm$^2$; and a doped dose of N/P is between $1e^{11}$ n/cm$^2$ and $5e^{15}$ n/cm$^2$, for example, it may be $1e^{13}$ n/cm$^2$, $5e^{11}$ n/cm$^2$, $5e^{15}$ n/cm$^2$. In an embodiment, sizes of the overlapped regions in the first direction may be between ⅕ and ⅓ of sizes of corresponding source-doped regions or drain-doped regions. The virtual structures 104 are arranged on the isolation structures between the drain-doped regions, which is beneficial to block subsequently implanted ions (such as LDD doped ions or source-drain NP doped ions), and is beneficial to prevent some doped ions from entering the isolation structures, the source-doped regions, the drain-doped regions, and other structures, to effectively isolate adjacent transistors from each other, improve a punch BV, and reduce a punch-through risk. Further, the overlapped regions are formed, which is beneficial to improve the effect of blocking ions and increase widths of the isolation structures in the direction, and is beneficial to improve isolations of transistors, and may not affect a channel of the device or a function of source and drain regions of the device. In addition, according to the foregoing solution of the disclosure, it is unnecessary to increase the sizes of the isolation structures (STI space), therefore it is unnecessary to increase the chip size, which may not increase the unit cost of the device. It is unnecessary to reduce the LDD dose of an LDD-doped region, and the BVDs of the device may not be affected due to the reduction of LDD doping, and the break down risk of the device may not be increased. It is unnecessary to increase the FLD dose either, ion implantation is performed below the isolation regions to increase the concentration of the substrate, reduce the consumption, and reduce a punch-through risk of the device. The body effect of the device may not be affected and voltage transmission efficiency may not be reduced. The punch-through risk of the device may be reduced without the foregoing sacrifices. In addition, FIG. 12 illustrates a voltage and current curve diagram of an example in which virtual structures are formed according to the disclosure and virtual structures are not formed. It may be seen from the TCAD simulation data shown in the figure that the punch BV is increased by 0.8 V.

In an example, the active regions may further include LDD-doped regions located at two sides of the gate structures. The periphery device (for example, HVNMOS) may have LDD-doped regions between the source-drain and the gate structure, which may reduce an electric field when the drain is applied with a high voltage. It should be noted that the LDD-doped regions are lightly doped drain regions well-known in the art.

In addition, as shown in FIGS. 5 to 11, and referring to FIGS. 1 to 4, the disclosure further provides a method for manufacturing a semiconductor device structure, the semiconductor device structure according to the foregoing solutions of the disclosure is manufactured by using the method for manufacturing a semiconductor device structure according to the disclosure. The semiconductor device structure may also be manufactured using other manners. The manufacturing method may include the following operations S1~S3.

Figure 5:
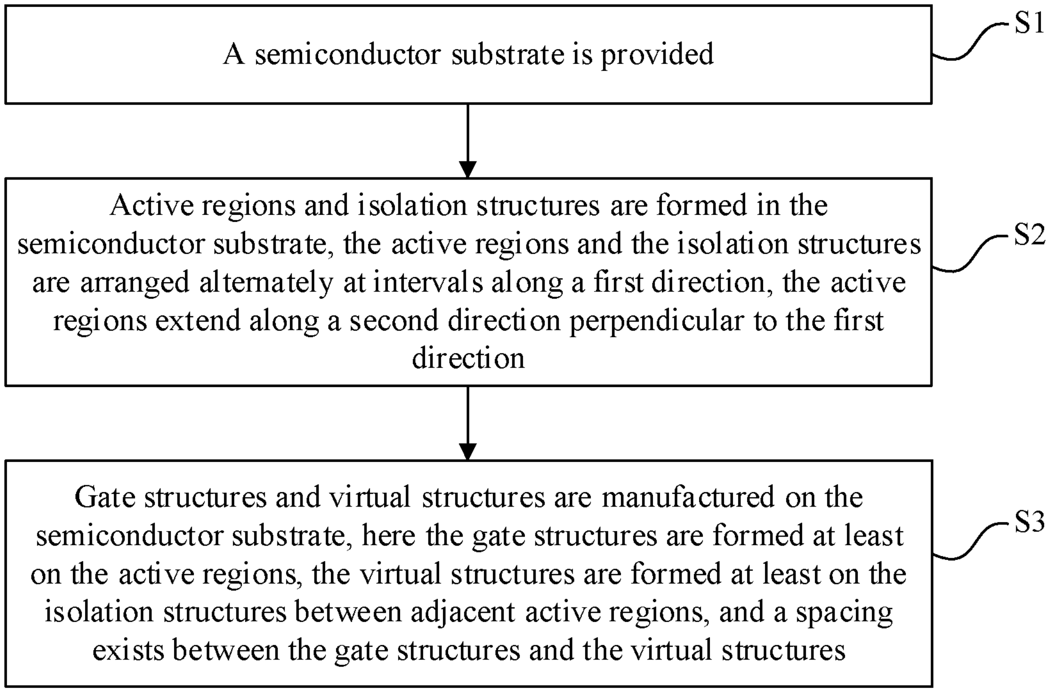
FIG. 5 illustrates a process flowchart of manufacturing a semiconductor device structure according to the disclosure.
Figure 6:
FIG. 6 illustrates a schematic diagram of providing a semiconductor substrate in an example of manufacturing a semiconductor device structure according to the disclosure.

First, as shown in operation S1 in FIG. 5 and FIG. 6, a semiconductor substrate 100 is provided. The semiconductor substrate 100 may be any semiconductor substrate described in the semiconductor device structure, and is not elaborated herein.

Figure 7:
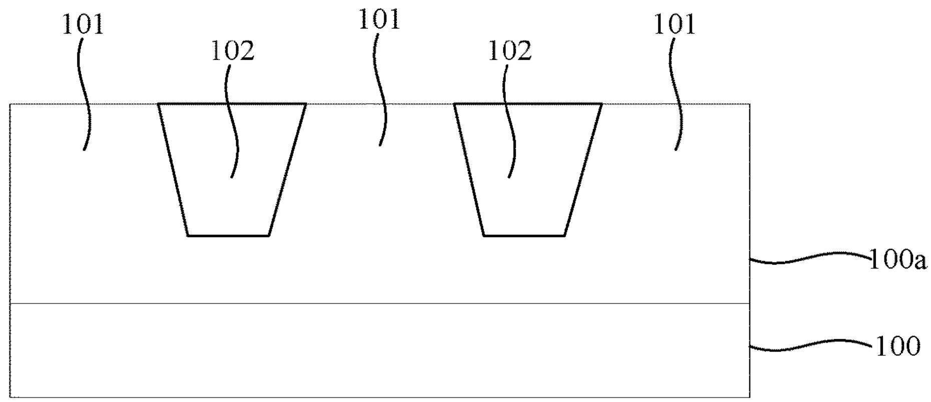
FIG. 7 illustrates a schematic diagram of forming active regions and isolation structures in an example of manufacturing a semiconductor device structure according to the disclosure.
Figure 8:
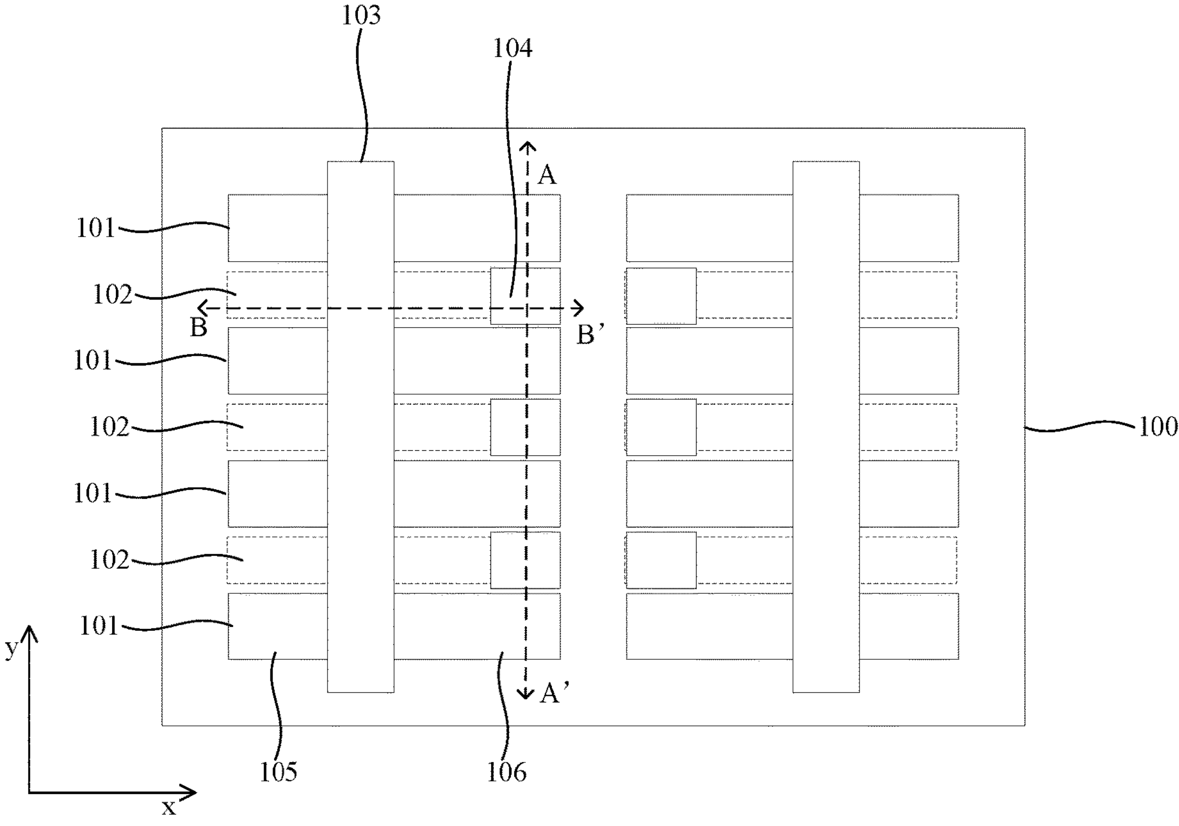
FIG. 8 illustrates a top view of forming gate structures and virtual structures in an example of manufacturing a semiconductor device structure according to the disclosure.
Figure 9:
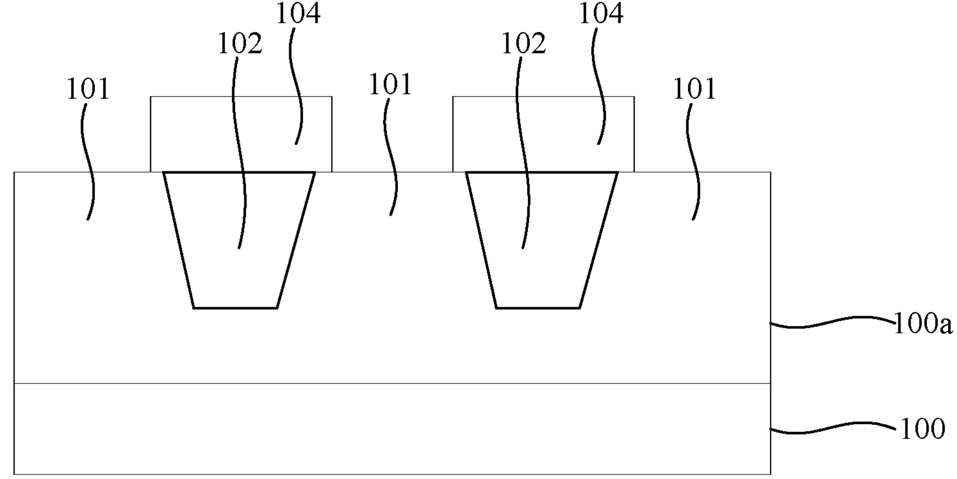
FIG. 9 illustrates a cross-sectional view of the structure shown in FIG. 8 in an AA' direction.
Figure 10:
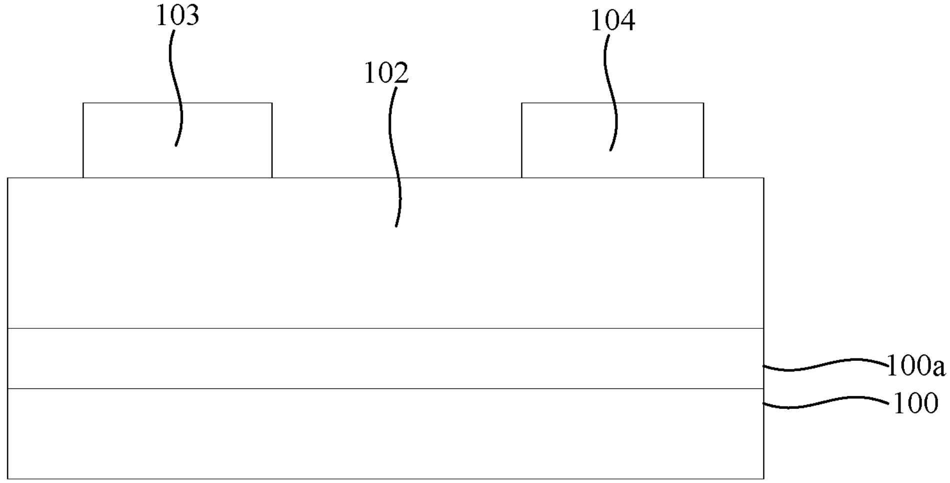
FIG. 10 illustrates a cross-sectional view of the structure shown in FIG. 8 in a BB' direction.
Figure 11:
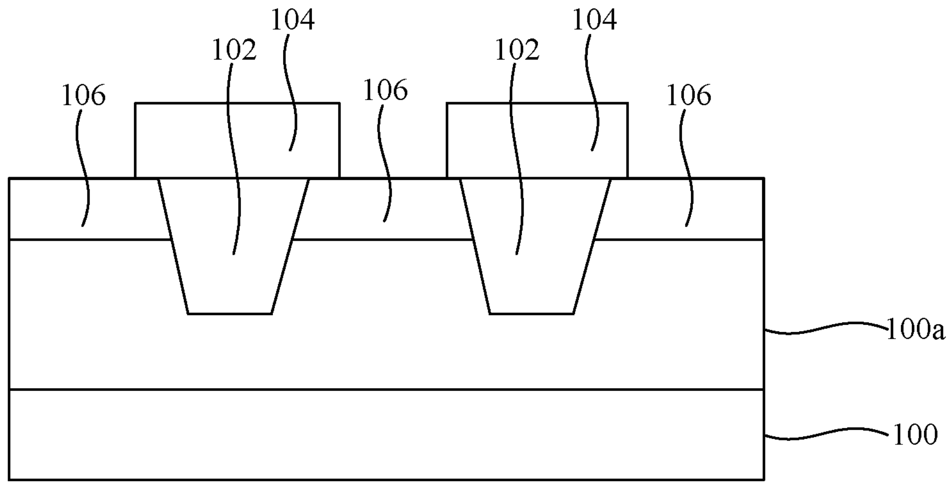
FIG. 11 illustrates a diagram of forming source-doped regions and drain-doped regions in an example of manufacturing a semiconductor device structure according to the disclosure.

Next, as shown in operation S2 in FIG. 5 and FIG. 7, active regions 101 and isolation structures 102 are formed in the semiconductor substrate 100, the active regions 101 and the isolation structures 102 are arranged alternately at intervals in a first direction, the active regions 101 extend along a second direction perpendicular to the first direction. The active regions and the isolation structures may refer to any active region and isolation structure described in the semiconductor device structure, and are not elaborated herein.

In addition, in an example, ion implantation is further performed on the semiconductor substrate 100 to form well regions 100*a*, before the active regions 101 and the isolation structures 102 are formed. The active regions 101 and the isolation structures 102 are formed in the well regions 100*a*. The well regions 100*a* of the periphery device (for example, a BL driver device transistor) may include a p-type doped well used in an n-channel MOSFET and an n-type doped well used in a p-channel MOSFET, which are referred to as a P well and an N well respectively. The distribution and concentration of dopant of the well affect device features of the periphery device. For a MOSFET device having a low threshold voltage (Vt), the well may be doped with a relatively low concentration, and form a low voltage p well or a low voltage n well. For a MOSFET having a high Vt, the well may be doped with a higher concentration, and form a high voltage p well or a high voltage n well. In some embodiments, in order to provide electrical isolation to a p-type substrate, a deep n well may be formed below the high voltage p well to be used by an n-channel MOSFET (also referred to as a high-voltage nMOSFET or HV NMOS) having a high Vt. The n well may be formed by using any suitable n-type dopant, such as phosphorus, arsenic, antimony, and/or any combination thereof. The p well may be formed by using any suitable p-type dopant, such as boron. The addition of dopant may be achieved by ion implantation followed by activation annealing, or by in-situ doping of the active device regions during epitaxy.

In an example, a method for forming isolation structures 102 is provided. Well regions or substrate materials around the isolation structures 102 form the active regions. The isolation structures 102 may be STI, and may be formed by patterning the substrate using photolithography and etching, filling an insulation material, and polishing the insulation material to form a coplanar surface on the semiconductor substrate 100. Insulation material used by STI may include silicon oxide, silicon oxynitride, TEOS, low-temperature oxide (LTO), high-temperature oxide (HTO), silicon nitride, etc. The insulation material used by STI may be deposited by using technologies such as chemical vapor deposition (CVD), physical vapor deposition (PVD), plasma-enhanced CVD (PECVD), low voltage CVD (LPCVD), high-density plasma (HDP) CVD, rapid thermal CVD (RTCVD), metal-organic CVD (MOCVD), atomic layer deposition (ALD), sputtering, thermal oxidation or nitridation, or a combination thereof. The formation of STI may also include an operation of high-temperature annealing to densify the provided insulation material to improve electrical isolation. Certainly, other STI structures may be adopted.

Next, as shown in operation S3 in FIG. 5 and FIGS. 8 to 10, gate structures 103 and virtual structures 104 are manufactured on the semiconductor substrate 100. The gate structures 103 are formed at least on the active regions 101, the virtual structures 104 are formed at least on the isolation structures 102 between adjacent active regions 101, and a spacing exists between the gate structures 103 and the virtual structures 104 in the second direction. For structure features of the gate structures 103 and the virtual structures 104, reference may be made to descriptions of the semiconductor device structure in the embodiment, and is not elaborated herein.

In an example, the gate structures 103 and the virtual structures 104 may be manufactured based on the same process. The virtual structures 104 and the gate structures 103 may be manufactured based on the same process, and it is unnecessary for the introduction of the virtual structures 104 to change any process conditions and operations either, which is simple and feasible.

In an example, the gate structures 103 may include gate units 107 that are in one-to-one correspondence with the active regions 101, span corresponding active regions 101 in the first direction, and are electrically connected based on the same metal layer 108.

In an example, the gate structures 103 may include strip gates spanning the active regions 101 in the first direction.

In an example, a spacing may exist between adjacent gate units 107 in the first direction, and projections of the gate units 107 corresponding to two adjacent active regions 101 in the first direction overlap with projections of the virtual structures 104 between the active regions 101 in the first direction.

In an example, a manner for forming the gate structures 103 and the virtual structures 104 is provided. The gate structures 103 and the virtual structures 104 may be formed, without adding additional process operations. A mask material layer may be formed on the semiconductor substrate 100, and then the mask material layer is patterned to obtain pattern windows of corresponding gate structures and virtual structures, and then gate materials are formed in the window to obtain the gate structures and the virtual structures. For example, the gate material layer formed in the window may include a gate dielectric medium and a gate conductor layer formed on the gate dielectric medium.

In an example, the gate dielectric medium may be made of silicon oxide, silicon nitride, silicon oxynitride, and/or high K dielectric films (for example, hafnium oxide, zirconia, alumina, tantalum oxide, magnesium oxide, or lanthanum oxide films and/or a combination thereof). The gate dielectric medium may be configured by any suitable method such as CVD, PVD, PECVD, LPCVD, RTCVD, sputtering, MOCVD, ALD, thermal oxidation or nitridation, or a combination thereof. In another example, the gate conductor may be made of metal or metal alloys such as tungsten, cobalt, nickel, copper, aluminum, and/or a combination thereof. In some embodiments, the gate conductor may also include a conductive material, such as titanium nitride (TiN), tantalum nitride (TaN), and the like. The gate conductor may be formed by any suitable deposition method, such as sputtering, thermal evaporation, electron beam evaporation, ALD, PVD, and/or a combination thereof. In other examples, the gate conductor may further include a polycrystalline semiconductor, such as polycrystalline silicon, polycrystalline germanium, polycrystalline silicon germanium, and any other suitable materials, and/or a combination thereof. In some embodiments, polycrystalline materials may be combined with any suitable type of dopant (such as boron, phosphorus, arsenic, etc.). In some embodiments, the gate conductor may also be an amorphous semiconductor with the material as described above.

In an example, the following operations may further be performed after the gate structures 103 and the virtual structures 104 are formed. Ion implantation is performed on the active regions 101 to form source-doped regions 105 and drain-doped regions 106 at two sides of the gate structures 103 respectively, to manufacture a source and a drain of the device, respectively.

In an example, the following operations may further be performed after the source-doped regions 105 and the drain-doped regions 106 are formed. Ion implantation is performed on the active regions 101 at two sides of the gate structures 103, to form lightly doped drain (LDD) regions (not shown in the figure).

For structure features and descriptions of the source-doped regions 105, the drain-doped regions 106, and the LDD-doped regions formed based on the above two examples, reference may be made to the descriptions of the semiconductor device structure, and is not elaborated herein.

In an example, the source/drain is combined with a high concentration of dopant. For example, for an n-type MOSFET, the dopant for the source/drain may include any suitable n-type dopant, such as phosphorus, arsenic, antimony, and/or any combination thereof. For a p-type MOSFET, the dopant for the source/drain may include any suitable p-type dopant, such as boron. The addition of dopant may be achieved by ion implantation followed by activation annealing of the dopant. The source/drain may contain the same material as the semiconductor substrate, such as silicon. In some embodiments, the source/drain may contain a different material from the semiconductor substrate 100 to achieve high performance. For example, on a silicon substrate, the source/drain for a p-type MOSFET may include SiGe, and the source/drain for an n-type MOSFET may combine with carbon. Formation of the source/drain with different materials may include back-etching the substrate material in the source/drain region, as well as using technologies such as epitaxy to provide new materials for the source/drain. The source/drain doping may also be achieved by in-situ doping during epitaxy.

In addition, at least one of the source/drain expansion (LDD doping regions) or halo regions (not shown) may be prepared along each side of the gate structures. At least one of the source/drain expansion or the halo regions is located within the active device regions below a gate stack layer, and may be implemented by improving short channel control of the periphery device with a channel length smaller than about 0.5 μm. Formation of at least one of the source/drain expansion or the halo regions may be similar to the formation of at least one of the source or the drain, but different implantation conditions (for example, dose, angle, energy, type, etc.) may be used to obtain an optimized doping profile, depth, or concentration.

In an example, the virtual structures 104 is located between the source-doped regions 105 of adjacent active regions 101 or between the drain-doped regions 106 of adjacent active regions 101. In addition, according to the descriptions of the foregoing semiconductor device structure, the virtual structures 104 may also be arranged between adjacent source-doped regions 105 and between adjacent drain-doped regions 106. That is, projections of the virtual structures 104 on the isolation structures 102 are located between the source-doped regions 105, and/or, projections of the virtual structures 104 on the isolation structures 102 are located between the drain-doped regions 106. In a further example, the virtual structures 104 also extend above the source-doped regions 105 or the drain-doped regions 106 of two adjacent active regions 101 along the first direction, to form overlapped regions. Sizes d of the overlapped regions in the first direction may be included between ⅕ and ⅓ of sizes of corresponding source-doped regions or drain-doped regions.

In conclusion, according to the semiconductor device structure and a method for manufacturing the same provided in the disclosure, the virtual structures are manufactured on isolation structures between adjacent active regions. Projections of the virtual structures on the isolation structures are located between the source-doped regions or between the drain-doped regions, and the virtual structures may also extend above adjacent source-doped regions or drain-doped regions, to form overlapped regions, which may block some ion implantation, effectively improve a punch BV of a BL memory, and reduce a punch-through risk. The virtual structures and the gate structures may be manufactured without changing any process condition or operation, and the process thereof is simple and feasible. The virtual structures according to the disclosure may not provide an additional device area. Therefore, the disclosure effectively overcomes various shortcomings in the related art and has a high industrial utilization value.

The above embodiments are illustrative of the principle and efficacy of the disclosure only and are not intended to limit the disclosure. The above embodiments may be modified or changed by any person skilled in the art without departing from the spirit and scope of the disclosure. Therefore, all equivalent modifications or variations made by those of ordinary skill in the art without departing from the spiritual and technical ideas revealed by the disclosure, are still covered by the claims of the disclosure.

The invention claimed is:

1. A semiconductor device structure, comprising:

a semiconductor substrate;

active regions and isolation structures located in the semiconductor substrate, the active regions and the isolation structures being arranged alternately at intervals in a first direction, the active regions extending along a second direction perpendicular to the first direction;

gate structures located at least on the active regions; and virtual structures located at least on the isolation structures, a spacing existing between the gate structures and the virtual structures in the second direction, wherein the active regions further comprise source-doped regions and drain-doped regions located at two sides of the gate structures respectively, and projections of the virtual structures on the isolation structures are located between the source-doped regions, or projections of the virtual structures on the isolation structures are located between the drain-doped regions.

2. The semiconductor device structure of claim 1, wherein the gate structures and the virtual structures contain a same material and have a same height.

3. The semiconductor device structure of claim 1, wherein the gate structures comprise gate units that are in one-to-one correspondence with the active regions, span corresponding active regions in the first direction, and are electrically connected based on a same metal layer.

4. The semiconductor device structure of claim 3, wherein a spacing exists between adjacent gate units, and projections of two gate units corresponding to two adjacent active regions in the first direction overlap with projections of corresponding virtual structures between the active regions in the first direction.

5. The semiconductor device structure of claim 1, wherein the gate structures comprise strip gates spanning the active regions in the first direction.

6. The semiconductor device structure of claim 1, wherein the active regions further comprise lightly doped drain regions located at two sides of the gate structures.

7. The semiconductor device structure of claim 1, wherein the semiconductor device structure comprises a bit line (BL) driver device.

8. The semiconductor device structure of claim 1, wherein the virtual structures extend above the source-doped regions along the first direction to form overlapped regions, or the virtual structures extend above the drain-doped regions along the first direction to form the overlapped regions.

9. The semiconductor device structure of claim 8, wherein sizes of the overlapped regions in the first direction are between ⅕ and ⅓ of sizes of corresponding source-doped regions or drain-doped regions.

10. A method for manufacturing a semiconductor device structure, comprising:

providing a semiconductor substrate;

forming active regions and isolation structures in the semiconductor substrate, the active regions and the isolation structures being arranged alternately at intervals in a first direction, the active regions extending along a second direction perpendicular to the first direction;

manufacturing gate structures and virtual structures on the semiconductor substrate, the gate structures being formed at least on the active regions, and the virtual structures being formed at least on the isolation structures, a spacing existing between the gate structures and the virtual structures in the second direction; and performing ion implantation on the active regions to form source-doped regions and drain-doped regions at two sides of the gate structures respectively, wherein projections of the virtual structures on the isolation structures are located between the source-doped regions, or projections of the virtual structures on the isolation structures are located between the drain-doped regions.

11. The method for manufacturing a semiconductor device structure of claim 10, wherein the gate structures and the virtual structures are manufactured based on a same process.

12. The method for manufacturing a semiconductor device structure of claim 10, wherein the gate structures comprise gate units that are in one-to-one correspondence with the active regions, span corresponding active regions in the first direction, and are electrically connected based on a same metal layer.

13. The method for manufacturing a semiconductor device structure of claim 12, wherein a spacing exists between adjacent gate units, and projections of the gate units corresponding to two adjacent active regions in the first direction overlap with projections of the virtual structures between the active regions in the first direction.

14. The method for manufacturing a semiconductor device structure of claim 10, further comprising after forming the source-doped regions and the drain-doped regions: performing ion doping on the active regions at two sides of the gate structures, to form lightly doped drain regions.

15. The method for manufacturing a semiconductor device structure of claim 10, wherein the virtual structures extend above the source-doped regions along the first direction to form overlapped regions, or the virtual structures extend above the drain-doped regions along the first direction to form the overlapped regions.

16. The method for manufacturing a semiconductor device structure of claim 15, wherein sizes of the overlapped regions in the first direction are between 1/5 and 1/3 of sizes of corresponding source-doped regions or drain-doped regions.

17. The method for manufacturing a semiconductor device structure of claim 10, wherein the gate structures and the virtual structures contain a same material and have a same height.

18. The method for manufacturing a semiconductor device structure of claim 10, wherein the gate structures comprise strip gates spanning active regions in the first direction.

19. The method for manufacturing a semiconductor device structure of claim 10, wherein the semiconductor device structure comprises a bit line (BL) driver device.

* * * * *